United States Patent [19]

Shannon

[11] Patent Number: 5,236,573
[45] Date of Patent: Aug. 17, 1993

[54] MIM DEVICES, THEIR METHOD OF FABRICATION AND DISPLAY DEVICES INCORPORATING SUCH DEVICES

[75] Inventor: John M. Shannon, Whyteleafe, England

[73] Assignee: U.S. Philips Corporation, New York, N.Y.

[21] Appl. No.: 504,189

[22] Filed: Apr. 2, 1990

[30] Foreign Application Priority Data

Apr. 28, 1989 [GB] United Kingdom ............... 8909807

[51] Int. Cl.$^5$ ........................... G11B 5/66; G02F 1/13
[52] U.S. Cl. ................................... 205/122; 205/189; 205/190; 359/58
[58] Field of Search ...................... 357/23.7, 4, 2; 340/784; 430/20, 311; 359/58, 60; 205/118, 122, 123, 124, 189, 190

[56] References Cited

U.S. PATENT DOCUMENTS

| | | | |
|---|---|---|---|
| 4,356,066 | 10/1982 | Kienle et al. | 205/122 |
| 4,413,883 | 11/1983 | Baraff et al. | 350/334 |
| 4,534,623 | 8/1985 | Araki | 350/334 |
| 4,683,183 | 7/1987 | Ono | 350/344 |
| 4,778,560 | 10/1988 | Takeda et al. | 350/332 |
| 4,820,024 | 4/1989 | Nishiura | 350/336 |
| 4,861,141 | 8/1989 | Nakazawa | 350/334 |
| 4,871,234 | 10/1989 | Suzuki | 358/58 |
| 4,895,789 | 1/1990 | Motte et al. | 350/334 |

FOREIGN PATENT DOCUMENTS 2091468  7/1982  United Kingdom ............... 350/334

Primary Examiner—William Mintel
Assistant Examiner—Tan Ho
Attorney, Agent, or Firm—Norman N. Spain

[57] ABSTRACT

A MIM device is fabricated by depositing sequentially on a substrate (14) a first conductive layer (30), a thin layer of insulative material (32) of for example silicon oxynitride or silicon nitride. The first conductive layer is formed of anodisable material, e.g. tantalum, and following deposition of the insulative layer the structure is subjected to an anodisation process whereby anodic material (41,35), is grown at any pin holes (40) or weak regions in the insulative layer so as to repair such defects. A second conductive layer (34) is then formed. An array of MIM devices formed in this manner can be used in an active matrix addressed LCD panel.

14 Claims, 3 Drawing Sheets

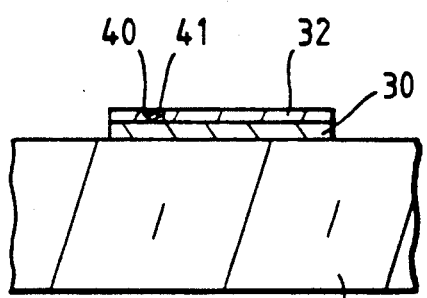
Fig. IA
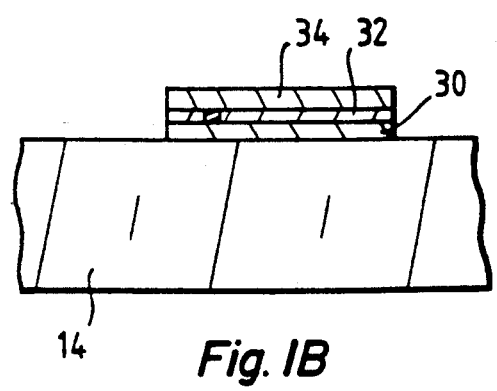
Fig. IB
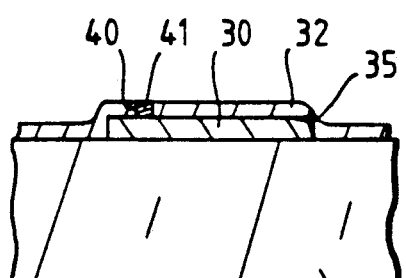
Fig. IC
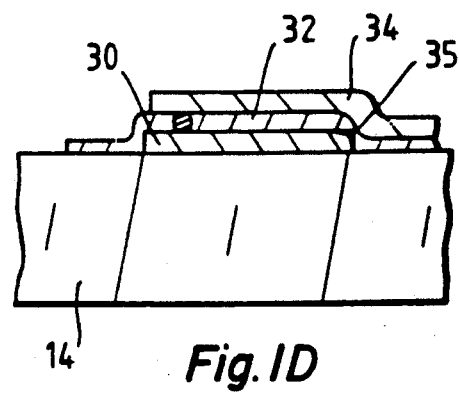
Fig. ID

MIM DEVICES, THEIR METHOD OF FABRICATION AND DISPLAY DEVICES INCORPORATING SUCH DEVICES

BACKGROUND OF THE INVENTION

This invention relates to MIM (Metal-Insulator-Metal) devices and their fabrication. MIM devices generally comprise on a substrate a thin film insulative layer sandwiched between two conductive layers across which, in use, a voltage is applied, the device exhibiting a non-linear resistive characteristic in operation. The invention relates also to a display device incorporating MIM devices.

MIM devices, which can be regarded as a type of diode structure, have been used in active matrix addressed liquid crystal display devices as switching elements for controlling operation of the device's picture elements. These two-terminal, non-linear devices offer the advantage over TFTs (thin film transistors) also used for such purposes in that they are comparatively simple to fabricate.

A typical MIM addressed LCD device consists of a pair of glass substrates carrying respectively a set of row address conductors and a set of column address conductors with individual picture elements being defined at the region of the intersections of the crossing row and column conductors. Each individual picture element comprises a picture element electrode carried on the one substrate with the row conductors, an opposing portion of one of the column conductors on the other substrate, together with the liquid crystal material therebetween, and is connected electrically in series with at least one MIM device between a respective row conductor and column conductor.

The MIM devices act as bidirectional switches to control operation of their associated picture elements. By virtue of their non-linear resistance behaviour, the devices exhibit threshold characteristic and in effect turn on in response to a sufficiently high applied field to allow video data signal voltages to be transferred to the picture elements to cause the desired display response. The switching behaviour of the MIM device results from tunnelling or hopping of carriers in the thin film insulative layer, and in this respect the voltage/resistance characteristic of the device is dependent on the magnitude of the electric field and thus on the nature and thickness of the insulative layer. When considering insulative layer thicknesses in the region of a few tens of nanometers the predominant mechanism in this behaviour appears to be the Poole Frenkel effect. Devices using such thicknesses of insulative layer have been found to offer more satisfactory performance for liquid crystal display device applications through their ability to provide the necessary on/off ratio at acceptable voltages.

One possible method of addressing the display device is to apply scanning voltage signals to the row conductors and data voltage signals to the column conductors. The matrix array of picture elements are addressed a row at a time to build up a display picture over one field.

In a known type of MIM structure, used in an LC display device, as described for example in U.S. Pat. No. 4,413,883, the insulative layer is formed as an anodised oxide surface layer on a metal layer constituting of the conductive layers. The one conductive layer consists e.g. of tantalum, which is anodised to form a thin film of insulative tantalum pentoxide on the surface. The insulative layer is then covered by a conductive layer of nickel, chromium, tantalum, aluminium or other metal. Anodic oxidation is a reasonably convenient process and the thickness of the oxide layer obtained can be controlled by the voltage applied for oxidation.

It is important to the successful operation of MIM devices that they have good insulation properties under low applied field conditions, so as to provide a high resistance, and that they become conductive at higher applied fields in a controlled manner to achieve characteristics similar to a forward biased diode. They need to have, therefore, appropriate non-linear characteristics suited to the operational criteria of a liquid crystal display device. These characteristics are dependent on the thickness of the insulative layer, as mentioned earlier, and are determined by the charge transfer mechanisms involved. In the above described type of structure, these mechanisms are influenced by the inclusion of impurities or defects in the anodised metal layer.

In other known types of MIM structures suitable for use in LC display devices, separately deposited thin film insulative layers are used. Insulative materials such as silicon nitride, silicon dioxide, silicon oxynitride, silicon monoxide and zinc oxide have been proposed. An example of a MIM structure employing silicon oxynitride material as the insulative layer is described in British Patent Application No. 8729517.

Although generally referred to as a Metal-Insulator-Metal device, conductive non-metal materials such as indium tin oxide (ITO) can be used as one or both of the "metal" layers.

MIM devices using insulative materials such as silicon oxynitride or silicon nitride are considered to offer superior performance characteristics in, particularly when used in a display device, by virtue of the lower dielectric constant of these materials compared with anodised tantalum, for example.

However, one problem likely to be experienced with such MIM devices is that defects such as short circuit can occur. With an array of MIM devices, as in a display device, one such short circuit can lead to an entire row or the entire array being unusable.

OBJECT AND SUMMARY OF THE INVENTION

It is an object of the present invention to provide an improved MIM device using the more favourable insulative layer materials.

It is another object of the present invention to provide an improved MIM device using a separately deposited insulative layer but which is less likely to suffer from the aforementioned problem.

It is further object of the invention to provide such a MIM device which is capable of being fabricated in arrays suitable for use in display devices.

According to one aspect of the present invention, a method of fabricating a MIM device comprises the steps of depositing on a first conductive layer carried on a substrate a thin film layer of insulative material, followed by a second conductive layer in superposed relationship, the method characterised in that the first conductive layer is of an anodisable material and in that, after the insulative layer has been deposited over the first conductive layer, the structure is subjected to an anodising operation.

It is thought that in known forms of MIM devices using separately deposited thin film insulative layers, short circuits can be caused by pin-holes or weak regions in the thin insulative layer between the conductive electrodes, leading to direct contact between the conductive layers or breakdown of the insulative layer in operation of the device.

The anodisation operation results in insulative anodic material being grown where any pin hole defects or other weak spots are present in the deposited insulative layer, so that in the finished device these defects are in effect healed, and the possibility of a short circuit between the first conductive layer and the second conductive layer over the insulative layer is greatly reduced.

Where a pin hole is present in the deposited insulative layer, anodic material grows into the pin hole, at least partially filling it and preventing conductive material from extending therethrough during information of the second conductive layer. Anodic material is also grown in the surface region of the first conductive layer underlying the pin hole. In the case of a weak spot being present, caused by an abnormally thin region of insulative material, anodic material is grown in the corresponding surface region of the first conductive layer to compensate for this.

The anodisation voltage is preferably chosen to be less than the voltage at which the finished MIM device is intended to be driven in operation.

The amount of anodisation created is controllable and dependent on the field applied across weak regions. By appropriate selection of an anodisation voltage of lower value than a typical drive voltage, the extent of anodisation is restricted to only those places where there would likely be a problem during operation and to only those amounts which are sufficient to heal defects, thereby allowing the composite dielectric layer thus formed to behave in the required manner in response to applied drive voltages to maintain desired I-V characteristics. The deposited insulative material thus remains the predominant component of the dielectric layer in determining the device's characteristic behaviour.

The first conductive layer may be formed of a metal such as tantalum, or aluminium, producing dielectric tantalum pentoxide and aluminium oxide, respectively, upon anodising, or any other suitable anodisable material producing a dielectric anodic layer such as niobium, titanium, molybdenum or hafnium.

The second conductive layer may be of a metal such as chromium, tungsten, tantalum, nichrome or titanium, although other conductive materials such as ITO or tin oxide could be used.

The insulative layer may be of various materials such as tantalum oxy-nitride, silicon dioxide, silicon monoxide, or silicon nitride, particularly non-stoichiometric silicon nitride.

Greatest benefits are obtained over prior art devices which use anodised metal as the dielectric material by employing an insulative material of lower dielectric constant than such anodised metals.

In a preferred embodiment the insulative layer comprises silicon oxy-nitride. Preferably this material is plasma deposition of formed by silicon nitride in the presence of oxygen. This results in the creation of a controlled tunnelling defect density in the material giving the MIM good electrical performance.

The plasma deposition technique also enables easy control of layer parameters such as thickness and produces a dielectric layer having a high degree of uniformity, any microscopic or macroscopic defects in the form of pin holes and weak regions being repaired by the anodisation operation. The material's structure allows electrical characteristics to be determined readily and in a reproducible manner. A high homogeneity of tunnelling sites can be obtained, with the density of the sites being conveniently controllable to meet the desired electrical criteria.

In addition, plasma deposition is a comparatively low temperature process (typically carried out at less than 300 degrees celcius) and therefore causes no difficulties in fabricating the layer so far as thermal stability of the substrate and any prior deposited layers on the substrate are concerned.

Silicon oxy-nitride has a low dielectric constant, in the region of 6, compared with, for example, tantalum pentoxide which has a dielectric constant of around 25, and therefore the MIM device exhibits a much lower capacitance effect in use than a MIM device using solely tantalum pentoxide for the insulative layer. This is significant in the use of the device as an active element in a liquid crystal display device, where it is necessary for optimum operation that the parasitic capacitance of the device is considerably less than the capacitance of the associated liquid crystal picture element.

According to another aspect of the present invention there is provided a method of fabricating an array of MIM devices on a substrate, which is characterised in that the MIM devices are fabricated using the method according to the first aspect of the invention, and in that the MIM devices are fabricated simultaneously. In the case of a large number of devices being fabricated simultaneously over a large area, as is required in a matrix display device, substantially identical and unvarying operational performance of the devices is obtained by this method, particularly when silicon oxynitride is used for the insulative layer.

In a preferred embodiment, the MIM devices are arranged in rows with the first conductive layers of the MIM devices in each row being connected electrically to a respective common row conductor, and the row conductors are used as contacts in the anodising operation. Conveniently, the first conductive layers of the MIM devices may comprise respective portions of the row conductors.

According to another aspect of the present invention, there is provided an active matrix addressed liquid crystal display device having a matrix array of picture elements comprising opposing electrodes carried on facing surfaces of two spaced substrates with liquid crystal material therebetween, each picture element being connected to one of a plurality of address conductors on one substrate via a switching element, characterised in that the switching elements comprises MIM devices fabricated in accordance with the first or second aspects of the present invention.

As with liquid crystal display devices incorporating known MIM structures as switching elements, the matrix array of MIM devices in the liquid crystal display device of the present invention may be formed simultaneously on the one substrate using large scale photo-etching techniques to define the various layers.

BRIEF DESCRIPTION OF THE DRAWINGS

MIM devices, their method of fabrication, and an active matrix addressed liquid crystal display device incorporating a plurality of such MIM devices as switching elements in accordance with the present invention will now be described, by way of example, with reference to the accompanying drawings, in which:

FIGS. 1A, 1B, 1C and 1D are schematic cross-sections, not to scale, of two embodiments of MIM devices of the invention at different stages of their fabrication;

DESCRIPTION OF THE PREFERRED EMBODIMENTS

Figure 2:
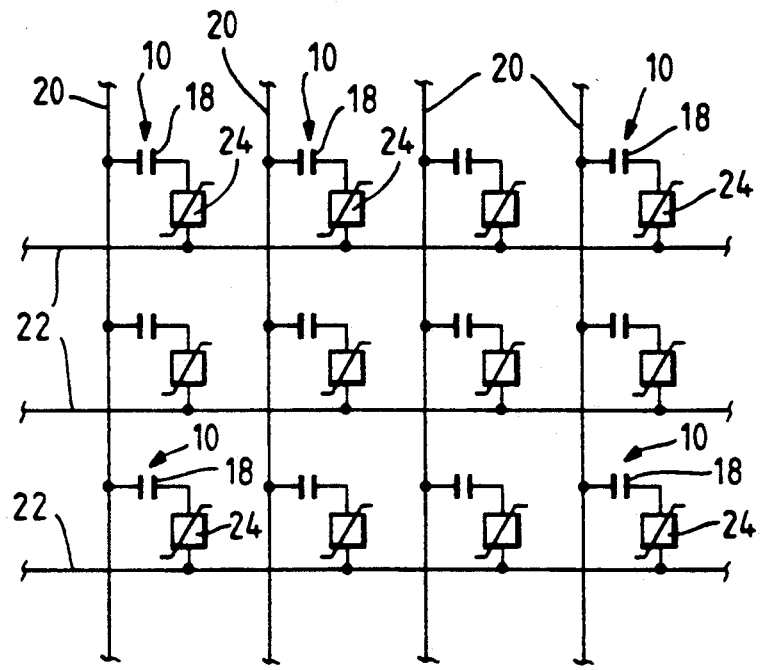
FIG. 2 is a schematic circuit diagram of part of a liquid crystal display device showing a few picture elements, each connected in series with a respective non-linear switching element in the form of a MIM device between row and column address conductors.

The MIM device comprises two conductive layers sandwiching an intermediate layer of insulative material, and exhibits a switching characteristic by virtue of its non-linear current/voltage behaviour. The device has a high resistance at low applied voltages and the device's resistance changes and drops significantly to allow adequate current to flow therethrough at higher applied voltages.

Referring to FIGS. 1A and 1B, the MIM device is formed on an insulative substrate 14, for example of glass, and comprises superposed layers consisting of a first conductive layer 30 of anodisable material, a second conductive layer 34 and a thin film of dielectric material 32 sandwiched directly therebetween. In this particular embodiment, the layer 30 comprises tantalum, the layer 34 comprises chromium and the dielectric layer 32 comprises silicon oxy-nitride. The silicon oxy-nitride material has a high atomic defect density resulting from the inclusion of oxygen, which creates a corresponding high density of tunnelling sites for quantum mechanical tunnelling effects, giving the device its non-linear characteristic.

The device is fabricated by depositing the layers 30 and 32 in superposed relationship on the substrate 14, as shown in FIG. 1A. The layer 30 is deposited and defined into a generally rectangular pad of area around 10 square micrometers using any suitable technique, for example, sputtering or evaporating tantalum material, followed by photo-etching. The silicon oxy-nitride layer 32 is deposited over the layer 30 using a plasma-enhanced low pressure chemical vapour deposition process, and is defined by photo-etching so as to be generally co-extensive with the layer 30 (FIG. 1A).

Plasma-enhanced low pressure chemical vapour deposition processes are generally well known and have been well documented. An example of such a process applied to silicon oxy-nitride, and the equipment for carrying out this process, is given in European Patent Specification No. 0032024, details of which are incorporated herein by reference.

It will be appreciated that for the purpose of providing the insulative layer of the MIM device the process is controlled to form silicon oxy-nitride whose composition is such as to give the required non-linear resistive characteristics when used in the form of a thin film.

Briefly, the plasma deposition involves placing the substrate 14 with the pad 30 thereon in a reaction chamber where it is exposed to a plasma, or glow discharge, of silane, (SiH$_4$), ammonia (NH$_3$) and nitrous oxide (N$_2$O) at a temperature around 300 degrees Celcius and a pressure of approximately 1 Torr, which results in the deposition on the substrate of silicon oxy-nitride. The silane, ammonia and nitrous oxide components are introduced into the reaction chamber in proportions suitable to produce a silicon-rich oxy-nitride material having the desired non-linear electrical characteristics.

The thickness of the silicon oxy-nitride layer may be between 20 and 150 nanometers, and preferably is between 40 and 80 nanometers.

The resulting structure is then subjected to an anodising operation in which the structure is immersed in a suitable anodising solution and the conductive layer 30 is connected to a potential so that a voltage is applied across the layer 32, which voltage is less than the voltage intended to be applied in normal operation of the completed MIM device. Phosphoric acid of a concentration around 0.001M to 1M can be used for the anodising solution. Alternatively, nitric acid, citric acid or tartaric acid can be used. As the anodic material is intended simply to provide insulation, and is not required to behave in the manner required by an anodic layer wholly constituting the insulative layer of a MIM device, the anodisation process need not be as particular. Atomic defect in this layer are unnecessary. For a high purity of anodic layer giving good insulation properties, citric acid provides beneficial results. Assuming the MIM device is intended to operate with drive voltages of around 11 to 15 volts, then anodisation may be performed by applying ten volts. Growth rate of tantalum pentoxide is approximately 1.6 nm per volt. Anodisation causes tantalum pentoxide to be grown where any pinholes may be present in the silicon oxy-nitride layer 32 and at the exposed edges of layer 30. Referring to FIG. 1A, an exemplary pin-hole, represented at 40, is thus at least partially filled with tantalum pentoxide 41 produced upon anodisation. A surface region of the layer 30 underlying the pin hole is also converted to tantalum pentoxide.

A thin layer of tantalum pentoxide is also formed by this operation at the interface between the layers 30 and 32 in any region where the deposited layer 32 is abnormally thin. Thus weak spots of the layer 32, caused by abnormally thin regions of silicon oxy-nitride, are also repaired with tantalum pentoxide material. The anodisation voltage is chosen having regard for typical drive voltages used in operation of the device and such that the extent of anodic material produced is limited only to those weak areas which would otherwise likely cause problems in operation of the finished device. If a larger anodisation voltage were used, anodic material could be formed more generally at the interface between layers 30 and 32, consequently altering the finished device's behaviour.

Defects in the MIM structure likely to lead to short circuits are therefore in effect repaired by the anodisation process, with a composite dielectric layer being formed.

The amount of tantalum pentoxide likely to be present intermediate the layers 34 and 30 in typical circumstances is very small compared with the amount of silicon oxy-nitride. Thus the silicon oxy-nitride predominates as the dielectric material and the effect on the finished device's performance of any tantalum pentoxide which may be grown is minimal. The resulting MIM device behaves in much the same way as would an MIM device having a purely silicon oxy-nitride dielectric layer without microscopic or macroscopic defects. Other anodisable materials may be used instead of tantalum such as aluminium, which is anodised using sulphuric acid.

To complete the MIM device, the second conductive layer 34 is deposited over the layer 32, by, for example, sputtering or evaporation, and defined into a pad by photoetching to produce the structure shown in FIG. 1B.

The thickness of the two conductive layers 30 and 34 is not critical but may typically be between 100 and 300 nanometers in the case of tantalum and chromium respectively.

Contact with the pad 30 may be achieved by forming an integral lead (not shown) which extends laterally over the substrate. In a display device, the pad 34 may serve as part of the picture element electrode. Alternatively, contact with the pad 34 may be achieved by defining a conductive layer which contacts the pad 34 through a window in an insulating layer deposited over the device.

In a practical device the dielectric layer 32 would not necessarily be substantially co-terminous with the conductive layer 30 in the above described manner. For simplified fabrication and ease of contacting the finished device it is preferable to use an extended area of dielectric material. In an alternative embodiment, therefore, a layer of silicon oxy-nitride is deposited over the layer 30 and also adjacent parts of the substrate 14 as shown in FIG. 1C. In other respects, this MIM device is fabricated in the same manner as before. Following the anodisation process, the second conductive layer 34 is deposited and defined so as to form an upper contact overlying the pad 30 together with an integral track which extends laterally over the edge of the pad 30 and across the adjacent surface area of the substrate 14, as shown in FIG. 1D.

By virtue of the anodisation step, the possibility of a short circuit in the completed MIM device due to either pin holes present in the dielectric layer 32 allowing the material of the layer 34 to contact the layer 30 or weak regions in the layer 32 is prevented. Weak regions are more likely in this structure where the insulative layer 32 is stepped over the edges of the layer 30. This stepping can lead to a reduced thickness of insulative material at these regions when the layer 32 is deposited. Any such weak regions are in effect repaired by anodic material being grown at surface regions of the pad 30 adjacent its edges during the anodisation process, as shown, for example, at 35 in FIG. 1C.

For use particularly in a display device, as will be described, an array of such MIM devices are conveniently fabricated simultaneously on the substrate 14 using standard large scale deposition and photo-etching techniques. The MIM devices are arranged in a row and column array. The devices of each row are connected to a respective common row conductor extending alongside the row of devices. This row conductor may be formed by deposition separately from the pads 30 of the devices and interconnected therewith, or, for convenience and simplification of manufacture, may be defined from the same deposited layer used to form the pads 30. The pads may comprise discrete portions of the row conductor.

During the anodisation operation, the ends of the row conductors are used as contacts and connected to a voltage source.

A liquid crystal display device using such an array of MIM devices will now be described with reference to FIGS. 2 and 3, which show respectively, the circuit configuration of a part of the device comprising a few, typical, picture elements and their associated MIM devices, and a cross-section through a small portion of this part of the device illustrating its construction.

Figure 3:
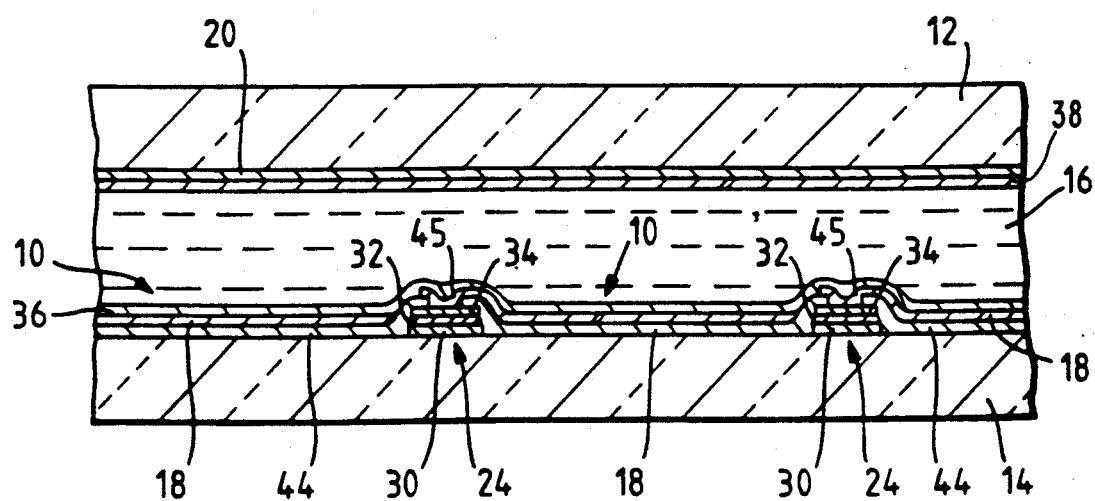
FIG. 3 is a diagrammatic cross-section through a portion of the display device of FIG. 2.

The device has a row and column matrix array of individual picture elements 10, only twelve of which are shown in FIG. 2 for simplicity. In practice there may be 100,000 or more elements.

Each element 10 is defined by a pair of electrodes carried on the facing surfaces of two, spaced, glass substrates 12 and 14 with TN (twisted nematic) liquid crystal material 16 therebetween. The substrate 14 carries the array of MIM devices, here referenced 24. In addition, the substrate 14 carries an array of individual, generally rectangular, picture element electrodes 18 of transparent ITO arranged in rows and columns and defining individual picture elements 10.

The substrate 12 carries a set of spaced, parallel, column address conductors 20 portions of which, where they overlie picture element electrodes 18, constitute the other electrodes of the elements.

The picture element electrodes 18 of all picture elements in the same row are connected on the substrate 14 to one of a set of parallel row address conductors 22 (FIG. 2), extending at right angles to the column conductors 20, via their associated, series-connected, MIM devices 24. Although only one MIM device is shown for each picture element, two or more MIM devices could be used with each picture element, in a known manner.

The individual picture element 10 are addressed in conventional fashion using scanning signals applied to each row conductor 22 in turn and video data signals applied appropriately, in synchronism, to the column conductors 20 to modulate light transmission through the picture elements in accordance with video information. The elements are typically driven using an applied voltage of between 11 and 15 volts. They are energised on a row at a time basis so as to build up a display picture, e.g. a TV picture, over one field.

The display device and its operation are similar to known display devices using MIM type non-linear switching elements. Accordingly, the foregoing description of operation of the device deliberately has been kept brief. For further information, reference is invited to the specification mentioned earlier whose disclosure in this respect is incorporated herein by reference.

Referring particularly to FIG. 2, each MIM device 24 is arranged laterally of the subsequently defined ITO picture element electrode 18. The pads 30 of the MIM devices 24 are formed as extensions projecting from, and integral with, the row conductors 22 (not visible in FIG. 2) by suitable definition of a common layer of tantalum. A layer of insulative material 44 such as silicon nitride is deposited completely over the MIM devices 24, the row conductors 22, and the remaining exposed areas of the substrate 14. The ITO electrodes 18 are defined on this layer 44 and are formed with integral bridging strips 45 that extend over the associated MIM device and contact the upper conductive layer 34 through windows etched in the layer 44 overlying the layer 34.

The exposed surface of the structure is then coated with a liquid crystal orientation layer 36 in a known manner.

The column conductors 20 and an orientation layer 38 are fabricated on the substrate 12 conventionally.

The materials used for the two conductive layers of the MIM devices can differ from the particular example described above. For example, aluminium may be used for the first layer. The second conductive layer 34 may be formed of tungsten, nichrome, gold or ITO.

In a simplified display device construction using devices similar to that shown in FIG. 1D, a continuous silicon oxy-nitride layer is deposited over the pads 30, the row conductors and at least adjacent exposed areas of the substrate 14. The picture element electrodes 18 are then defined on this layer of silicon oxy-nitride using ITO together with integral bridging strips which extend from the electrodes 18 over the silicon oxy-nitride material covering an adjacent pad 30. In this case, the MIM device is constituted by a pad 30 and overlying portions of the silicon oxy-nitride and ITO materials. As such, the second conductive layer of the device is formed integrally with the electrode 18.

The MIM devices using silicon oxy-nitride as the dielectric thin film layer formed in the above described manner exhibit non-linear characteristics in operation particularly suited to liquid crystal display devices. They have an almost exponential relationship between current and applied voltage and are capable of operating at high level multiplexing with the required duty ratio for TV display purposes. Because the silicon oxy-nitride has a low dielectric constant, their parasitic capacitance is very low compared with the capacitance of their associated picture element 10.

Figure 4:
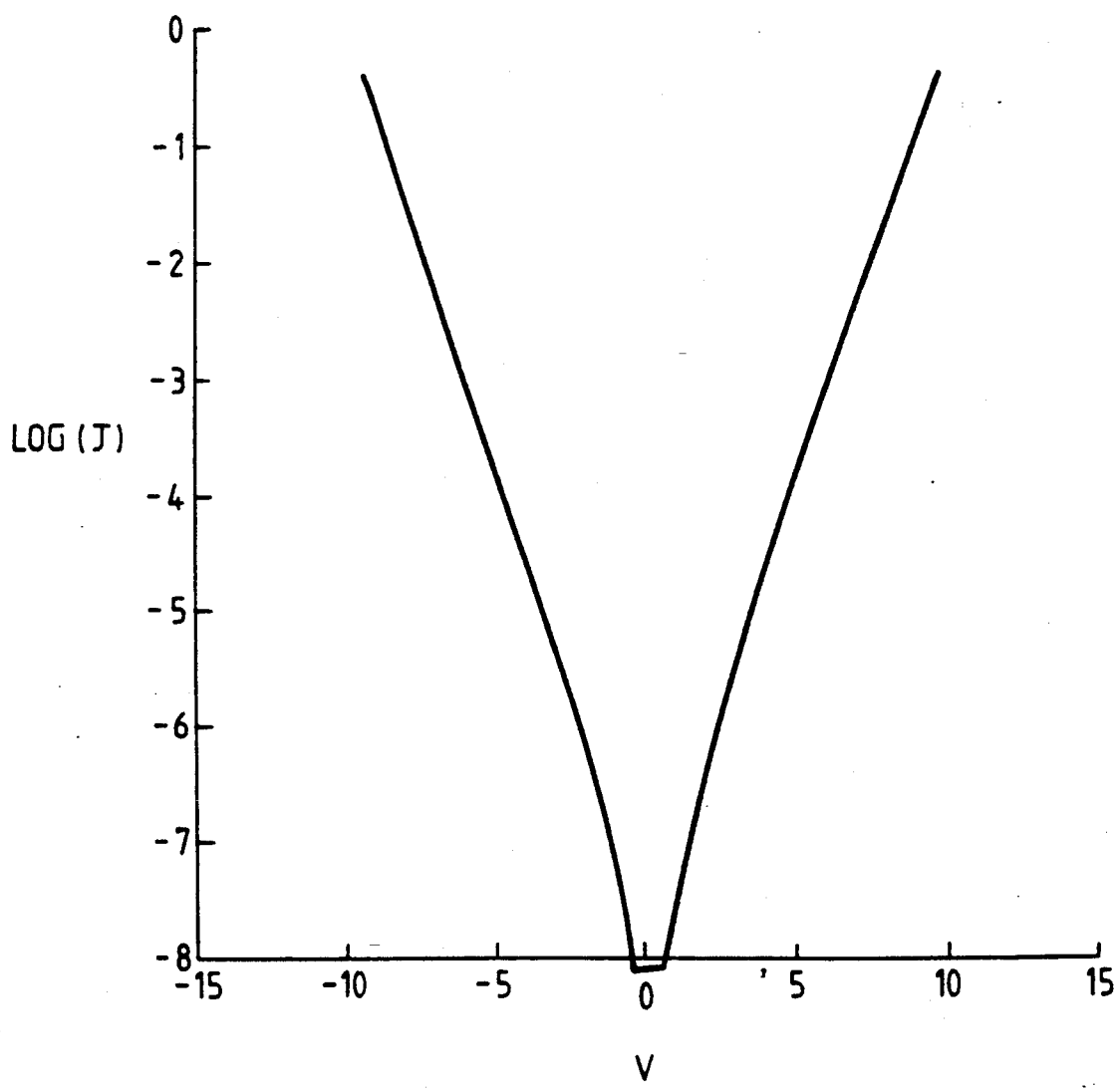
FIG. 4 is a graphic illustration of the electrical performance of a typical one of the MIM devices of the display device, in terms of the relationship between applied voltage, V, versus the log of current density, J, in the device.

FIG. 4 shows graphically the expected electrical characteristics of the MIM device where applied voltage, V, over the range of voltages occurring in use of the MIM device in the display device, is plotted against the log of the current density (J) in amps per square cm through the device in an embodiment of the device in which the silicon oxy-nitride layer has a thickness of 40 nanometers and in which continuous, rather than pulsed, DC voltage is used.

As previously mentioned, however, it is envisaged that other insulative materials might be used to form the layer 32, for example non-stoichiometric silicon nitride or silicon dioxide.

I claim:

1. A method of fabricating a MIM device for operation at a predetermined driving voltage, the method comprising the steps of depositing on a first conductive layer carried on a substrate a thin film layer of insulative material and a second conductive layer in superposed relationship, characterized in that the first conductive layer is of anodisable material and in that after the insulative layer has been formed over the first conductive layer and before the second conductive layer is formed, the first conductive layer is subjected to an anodization voltage as part of an anodizing operation for said first conductive layer and in that the anodization voltage is less than the driving voltage of the resultant fabricated MIM device.

2. A method according to claim 1, characterized in that the first conductive layer comprises tantalum.

3. A method according to claim 1, characterized in that the first conductive layer comprises aluminium.

4. A method according to claim 1, characterized in that the insulative layer comprises silicon oxy-nitride.

5. A method according to claim 4, characterized in that the silicon oxy-nitride material is plasma deposited.

6. A method of fabricating according to claim 1 characterized in that an array of MIM devices on a substrate is fabricated with the MIM devices in the array being formed simultaneously.

7. A method according to claim 6, characterized in that the MIM devices are arranged in rows with the devices of each row being connected to a respective common row conductor, the row conductors being formed prior to deposition of the second conductive layers of the MIM devices and used as contacts in the anodizing operation.

8. A method according to claim 7, characterized in that the row conductors and the first conductive layers of the MIM devices are formed from a single layer of deposited material.

9. The method of claim 1 characterized in that the first conductive layer comprises tantalum.

10. The method of claim 1 characterized in that the first conductive layer comprises aluminum.

11. The method of claim 1 characterized in that the insulative layer comprises silicon oxy-nitride.

12. The method of claim 1 characterized in that the silicon oxy-nitride is plasma deposited.

13. A method of fabricating an array of MIM devices on a substrate, the MIM devices being formed simultaneously and the method of forming each MIM device comprising the steps of depositing on a first conductive layer carried on a substrate a thin film layer of insulative material and a second conductive layer in superposed relationship, characterized in that the first conductive layer is of anodisable material and in that after the insulative layer has been formed over the first conductive layer and before the second conductive layer is formed, the first conductive layer is subjected to an anodization voltage as part of an anodizing operation for said first conductive layer.

14. A method of fabricating a MIM device for operation at a predetermined driving voltage, the method comprising the steps of depositing on a first conductive layer carried on a substrate a thin film insulative layer of silicon oxy-nitride and a second conductive layer in superposed relationship, characterized in that the first conductive layer is of anodisable material and in that after the insulative layer has been formed over the first conductive layer and before the second conductive layer is formed, the first conductive layer is subjected to an anodization voltage as part of an anodizing operation for said first conductive layer.

* * * * *